US00RE36442E

United States Patent [19]

Kardos

[11] E Patent Number: Re. 36,442

[45] Reissued Date of Patent: Dec. 14, 1999

[54] ADAPTER WHICH EMULATES BALL GRID ARRAY PACKAGES

[75] Inventor: Gabor Kardos, Sunnyvale, Calif.

[73] Assignee: Emulation Technology, Inc., Santa Clara, Calif.

[21] Appl. No.: 08/857,889

[22] Filed: May 16, 1997

Related U.S. Patent Documents

Reissue of:

[64] Patent No.: 5,418,471
Issued: May 23, 1995
Appl. No.: 08/187,578
Filed: Jan. 26, 1994

[51] Int. Cl.[6] ..... G01R 1/04

[52] U.S. Cl. ..... 324/758; 439/65

[58] Field of Search ..... 324/754, 758, 324/755, 761; 257/668; 228/180.21, 18.22; 439/65

[56] References Cited

U.S. PATENT DOCUMENTS

| | | | |
|---|---|---|---|
| 4,564,251 | 1/1986 | Hansen et al. | 439/71 |
| 4,830,264 | 5/1989 | Bitaillou et al. | 228/180.21 |
| 4,862,076 | 8/1989 | Renner et al. | 324/755 |
| 5,122,064 | 6/1992 | Zarreii | 439/65 |
| 5,291,062 | 3/1994 | Higgins, III | 257/698 |
| 5,293,067 | 3/1994 | Thompson et al. | 257/668 |
| 5,477,933 | 12/1995 | Nguyen | 174/262 |

*Primary Examiner*—Josie Ballato
*Assistant Examiner*—Russell M. Kobert
*Attorney, Agent, or Firm*—Skjerven, Morrill, MacPherson, Franklin & Friel LLP; Brian D. Ogonowsky

[57] ABSTRACT

An adapter for emulating a ball grid array type package includes a dielectric substrate having an array of holes formed therein. A layer of conductive material is deposited on a bottom surface of the substrate and onto the inner walls of the holes. The bottom surface of the substrate is then selectively etched to form separate conductive traces extending from each of said holes and terminating in a pad proximate to each hole. A conductive pin is inserted into each of the holes and soldered in place. The pads are then provided with a small ball of solder, using well known techniques, so that the bottom surface of the substrate now appears virtually identical to a bottom surface of a conventional ball grid array type package. The adapter is then mounted to an array of contact pads on a printed circuit board by fusing the solder balls to corresponding contact pads on the board. The pins are now electrically connected to the contact pads on the circuit board and may be connected to a tester.

25 Claims, 3 Drawing Sheets

ADAPTER WHICH EMULATES BALL GRID ARRAY PACKAGES

Matter enclosed in heavy brackets [ ] appears in the original patent but forms no part of this reissue specification; matter printed in italics indicates the additions made by reissue.

FIELD OF THE INVENTION

This invention relates to adapters which emulate a particular surface mounted package for testing purposes.

BACKGROUND OF THE INVENTION

Various types of test adapters are known which either connect to leads of a particular type of surface mounted package mounted on a printed circuit board or connect directly to terminals on a printed circuit board, where the terminals on the board are configured for accepting a particular type of surface mounted package. The adapter is, in turn, connected to a tester for testing the printed circuit board or the package itself. The adapter, thus, must contain electrical contacts which correspond to the terminal configuration of a particular type of surface mounted package intended for use with the printed circuit board being tested. Various types of adapters for connection between a printed circuit board and a tester are described in U.S. Pat. Nos. 4,862,076 and 4,564,251 and in U.S. patent application Ser. No. 08/079,721, entitled "Test Adapter for Packaged Integrated Circuits", assigned to the present assignee and incorporated herein by reference.

A very area-efficient type of surface mounted package which is increasing in popularity is a ball grid array package illustrated in FIG. 1. In FIG. 1, a packaged integrated circuit 10 contains a silicon die having its pads electrically connected to respective ones of conductive solder balls 12 distributed on the bottom surface of the package 10 in an array. A printed circuit board 14 has formed on its surface a corresponding array of conductive pads 16 which align with the array of conductive solder balls 12. Conductive traces (not shown) on printed circuit board 14 lead from each of the pads 16 to other circuitry on the board 14. To mount the package 10 to the board 14, the package 10 is positioned on top of board 14 and the resulting structure is heated until the solder balls 12 melt and fuse to the connect pads 16.

The ball grid array type packages provide a high density of terminals at a very low cost. Also, by not having any pins extending from the package, there is no risk of bending any leads and destroying the product.

The inventor is not aware of any adapters which emulate ball grid array type packages. The design of a ball grid array type adapter presents numerous problems. One problem is that the contact pads 16 and conductive balls 12 may be separated by a millimeter or less, which makes it extremely difficult to reliably provide individual connectors on an adapter for connecting to each of contact pads 16 without taking up any more area than the area of the intended package 10. Further, since the adapter must be soldered onto the contact pads 16 of the board 14, the heating process must not adversely affect the adapter. Thirdly, the adapter must be made inexpensively, since the user may choose to discard the board 14 after testing instead of spending time removing the adapter from the board 14.

What is needed is an inexpensive and reliable adapter which can connect to an array of contact pads on a board for emulating a ball grid array type package.

SUMMARY

An adapter for emulating a ball grid array type package is presented herein. The adapter includes a dielectric substrate having an array of holes formed therein. A layer of conductive material is deposited on a bottom surface of the substrate and onto the inner walls of the holes. The bottom surface of the substrate is then selectively etched to form separate conductive traces extending from each of the holes and terminating in a pad proximate to each hole. A conductive pin is inserted into each of the holes. These pins are then soldered to the conducting walls of their respective holes so that each pin is now electrically connected, via a conductive trace, to a respective pad on the bottom surface of the substrate. A thin dielectric layer is formed on the bottom surface of the substrate and selectively etched to only reveal the pads. These exposed pads align with an array of conductive pads on a printed circuit board. The exposed pads are then each provided with a small ball of solder, using well known techniques, so that the bottom surface of the substrate now appears virtually identical to a bottom surface of a ball grid array type package.

Each pin extending from the top surface of the substrate is now in electrical contact with a respective solder ball on the bottom surface of the substrate via the conductive traces. The adapter is then mounted to an array of contact pads on a printed circuit board by fusing the solder balls to corresponding contact pads on the board. The thin dielectric layer not only insulates portions of the bottom surface of the adapter from the board but prevents the pins (soldered in place) from extending through the bottom surface of the substrate when heating the adapter during the solder ball fusing step.

The pins on the adapter may now receive a suitable connector which makes electrical contact with the pins, where the connector is connected to a tester or other device. In the preferred embodiment, the pins extending from the top surface of the substrate are female type connectors which receive a male type connector connected to a tester.

DETAILED DESCRIPTION OF THE PREFERRED EMBODIMENTS

Figure 1:
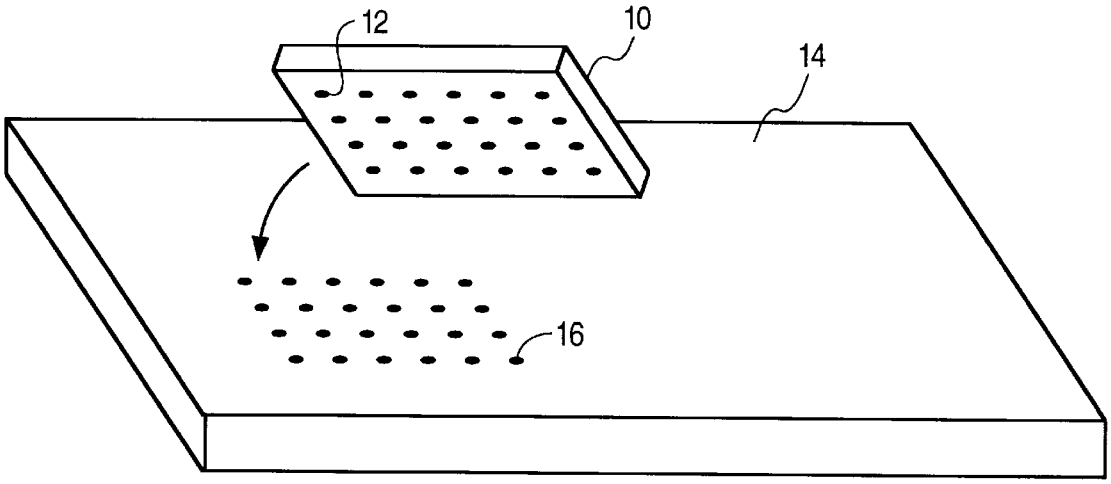
FIG. 1 (PRIOR ART)
FIG. 1 illustrates a prior art ball grid array type package and a corresponding contact pad structure on a printed circuit board.
Figure 2:
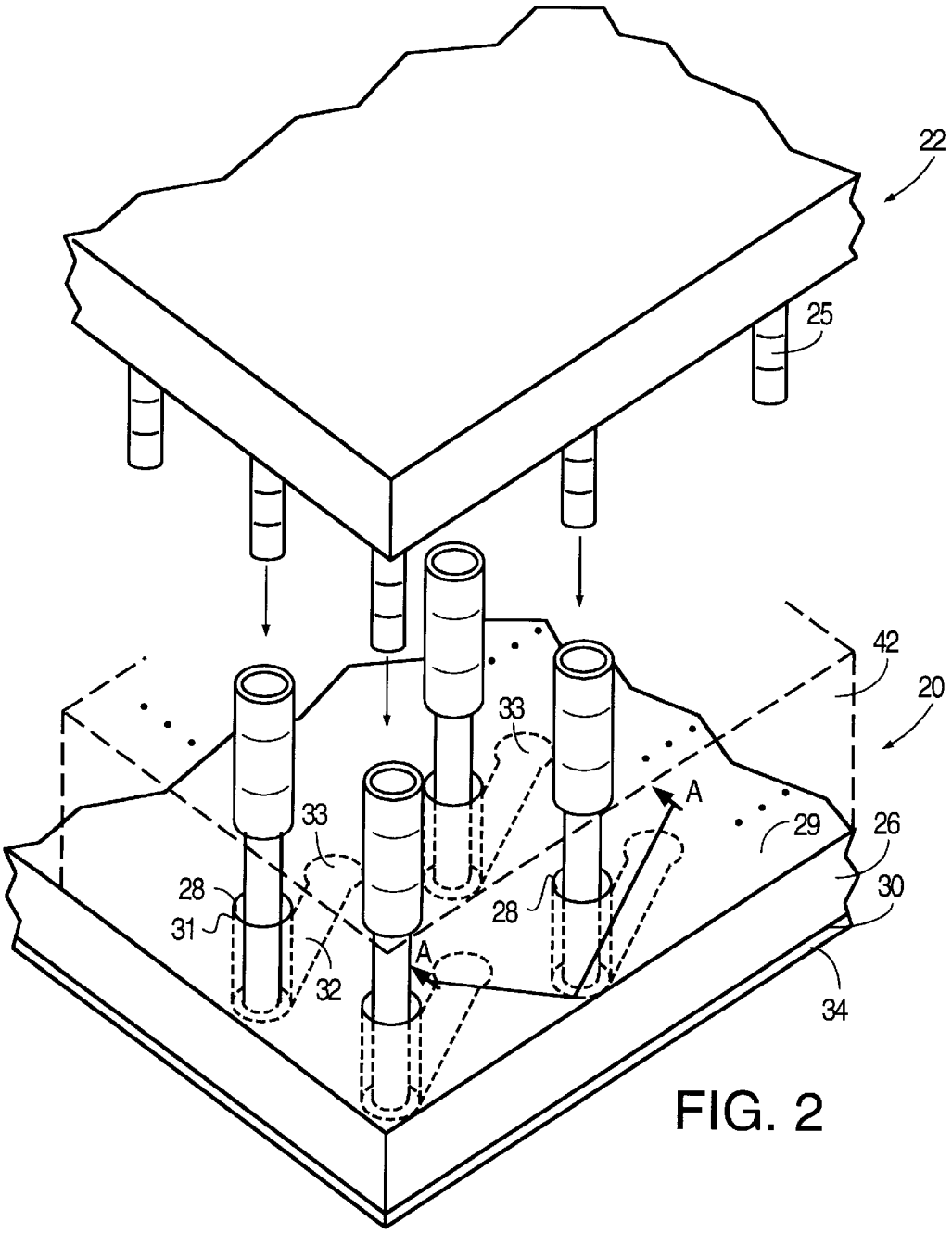
FIG. 2 is a perspective view illustrating the construction of the inventive adapter and a removable connector for engaging the pins of the adapter.

FIG. 2 illustrates a portion of the inventive adapter 20 which is configured to be mounted on an array of contact pads, such as contact pads 16 in FIG. 1, for receiving a ball grid array type package.

Also shown in FIG. 2 is a connector portion 22 which connects to the pins 24 of the adapter 20. Connector 22 has its respective pins 25 connected via wires to a tester or other device (not shown). Only portions of adapter 20 and connector 22 are shown in FIG. 2. An entire adapter 20 and connector 22 would include a repetition of the patterns of pins 24 and 25 as needed to emulate a particular ball grid array type package having a particular terminal count. Terminal counts for relatively large ball grid array type packages may be on the order of 200. Accordingly, to emulate these packages, 200 pins 24 would be incorporated in adapter 20.

The adapter 20 will typically have a square shape with sides ranging from 7.0 mm to 57.5 mm, although other sizes and shapes may be used depending on the particular package to be emulated. Typical pin 24 pitches may be 1.00 mm, 1.25 mm, and 1.50 mm, depending upon the particular package to be emulated.

Adapter 20 comprises a dielectric substrate 26, which may be formed of a resin, a plastic, or other conventional dielectric material. In one embodiment, this substrate 26 has a thickness of approximately 2.50 mm.

An array of holes 28 are drilled through substrate 26 in either a staggered row fashion or in a uniform grid, as shown in FIG. 2. Holes 28 may have a practical diameter on the order of 0.30 mm to 0.60 mm. Larger diameter holes would be possible with a less densely populated pin 24 arrangement. Holes 28 may be laser drilled or drilled using any conventional technique, such as by using a programmable drilling machine.

The top surface 29 and bottom surface 30 of the substrate 26 are then plated with copper or another conductive material using electroless plating or other conventional plating technique. This plating step not only coats the flat top and bottom surfaces of substrate 26 but also coats the walls of holes 28. A layer of resist is then applied to the top and bottom surfaces of substrate 26 and patterned using a conventional photolithographic and etching process. The resist exposes a ring 31 of copper around each hole 28 on the top surface 29 and exposes traces 32 on the bottom surface 30 which extend from a ring around each hole 28 and terminate in a pad 33. The exposed copper portions (including the walls of holes 28) are then plated with solder or gold (plating 35 in FIG. 3), using a suitable electroplating, dip-plating, or other conventional plating process.

The remaining resist is then removed to expose the underlying copper. A wet etch, using an ammonia based etchant, is then used to dissolve the exposed copper. The solder or gold plating 35 (and the underlying copper) is not dissolved by the etchant. The conductive walls of the holes 28 are now each electrically connected through the associated trace 32 to a pad 33.

Next, a heat resistant dielectric layer 34, such as Liquid Photo-Imagable (LPI), is either adhesively secured to the bottom surface 30 of substrate 26 as a sheet or deposited on the bottom surface 30 in liquid form and then cured. This dielectric layer 34 may be virtually any thickness from a few microns to less than a mil.

The dielectric layer 34 is then selectively etched to expose pads 33.

Figure 3:
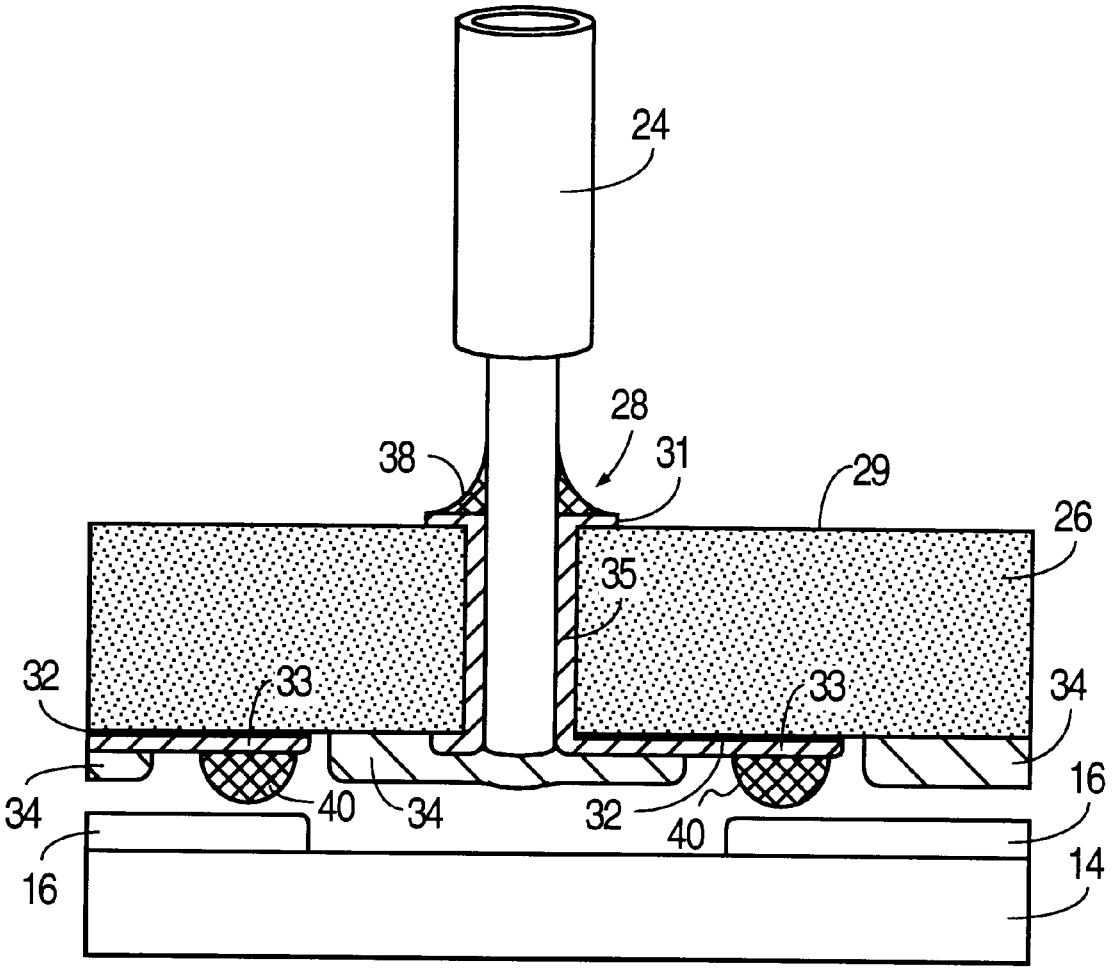
FIG. 3 is a cross-sectional view along line A—A in FIG. 2 illustrating certain features of the adapter of FIG. 2.

FIG. 3, taken along line A—A in FIG. 2, illustrates the dielectric layer 34, which is etched to reveal the pads 33. FIG. 3 also illustrates the solder or gold plating 35 covering the walls of each of the holes 28 and covering the traces 32 on the bottom surface 30 of the substrate 26 leading to pads 33.

Pins 24 are then inserted through holes 28 as shown in FIGS. 2 and 3. These holes 28 have the dielectric layer 34 covering the bottom ends of the holes 28 to prevent pin 24 from extending beyond the bottom surface 30 of the substrate 26.

A female type pin 24 is shown in the preferred embodiments of FIGS. 2 and 3. Pins 24 may have any length suitable for a particular application. In one embodiment, the length of pins 24 is on the order of 1 cm. In the preferred embodiment, the pins 24 are formed of beryllium copper plated with nickel and gold.

To secure pins 24 in position and to ensure reliable electrical contact between pins 24 and pads 33, solder 38 is flowed over the top surface of substrate 26 to solder pins 24 to the plating 35 around and within the holes 28.

Figure 4:
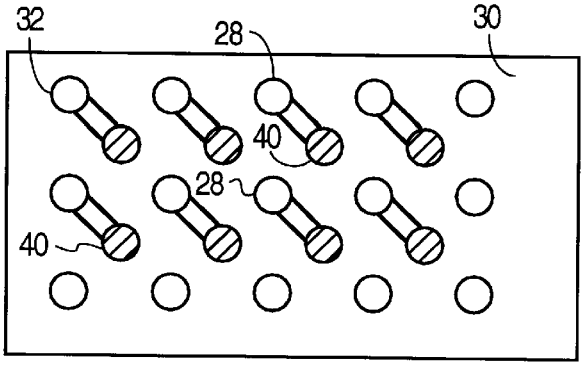
FIG. 4 is a plan view of a portion of the bottom surface of the adapter of FIG. 2 showing the conductive traces extending from holes formed in the substrate and terminating in pads.

Solder balls 40 (FIGS. 3 and 4) are then deposited on the pads 33 on the bottom surface 30 of substrate 26 through the openings in the dielectric layer 34 so as to adhere to the plating 35 coating the pads 33. FIG. 4 shows a portion of the bottom surface 30 of adapter 20. Solder balls 40 are shown in FIG. 4 by the hatched circles. The solder balls 40 may be automatically deposited by a programmed machine, using one or more syringes, which is conventionally used for forming ball grid array type packages.

Figure 5:
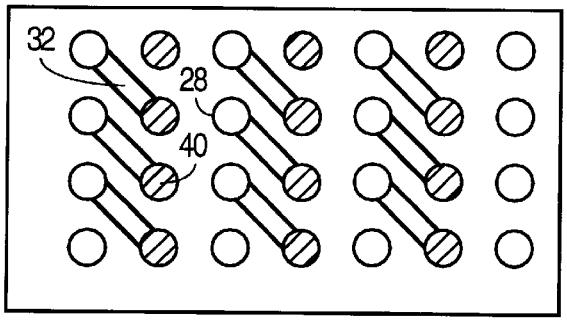
FIG. 5 is a plan view of a portion of the bottom surface of another embodiment of the inventive adapter.

FIG. 5 illustrates the bottom surface of an adapter 20 which is similar to that shown in FIG. 4 but with a different arrangement of holes 28 and traces 32. The arrangement of FIG. 4 enables a higher pin 24 density.

Figure 6:
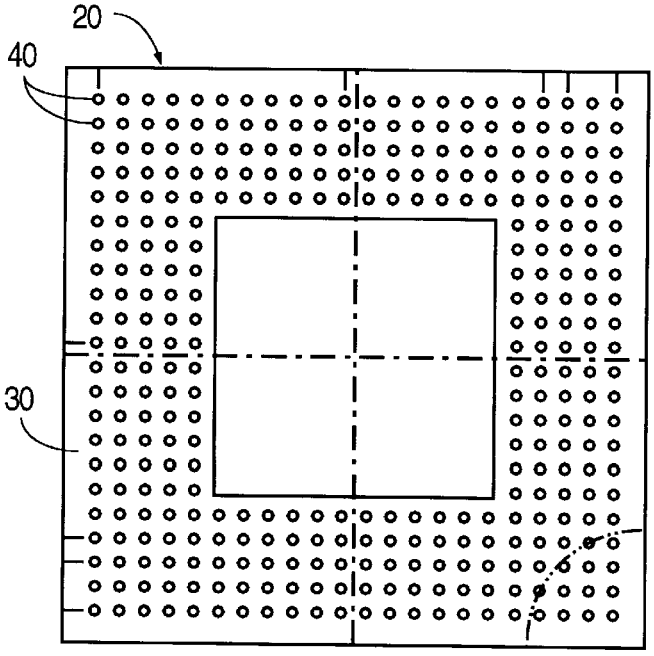
FIG. 6 is a plan view of one example of a bottom surface of the inventive adapter having a large number of terminals.

FIG. 6 illustrates the bottom surface 30 of the adapter 20 in a typical embodiment having 340 terminals (i.e., 340 solder balls 40). Traces and holes are not shown in FIG. 6 for simplicity.

To prevent pins 24 from being inadvertently bent, an epoxy layer 42 (FIG. 2) may be formed to surround the pins 24. As an alternative, substrate 26 may be made thicker, or pins 24 may be made shorter, to further reduce the likelihood of inadvertent bending of pins 24.

The resulting adapter 20 may then be aligned and positioned over contact pads 16 (FIG. 3) on a printed circuit board 14. The adapter 20 is then heated to melt the solder balls 40 and fuse the solder to the contact pads 16. This heating step does not affect the position of pins 24, since pins 24 are prevented from moving in a downward vertical direction by dielectric layer 34 blocking the hole 28 opening.

The adapter 20, now soldered to the printed circuit board 14, may now be engaged by connector 22 (FIG. 2) for testing the printed circuit board 14. Connector 22 is connected via wires to a tester or other device which may emulate the electrical characteristics of the actual ball grid array package to be ultimately used in the final production model of the printed circuit board 14. After testing the board 14, the connector 22 is removed from adapter 20. The adapter 20 may then be removed from the board 14 or the board 14 discarded.

Adapter 20 may be made as an individual unit or may be formed along with other identical adapters 20 in a same substrate 26, in which case the individual adapters 20 are then separated from each other by sawing the substrate 26.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An adapter for emulating a ball grid array type package comprising:

a dielectric substrate, said substrate having an array of holes formed therein, each of said holes having walls at least partially plated with a conductive material, each of said holes having an opening in a top surface of said substrate;

conductive traces formed on a bottom surface of said substrate, each of said traces extending from said conductive material plating a wall of an associated one of said holes and terminating at a first end;

a plurality of conductive pins, each of said pins being inserted into a respective one of said holes and projecting through said top surface, each of said pins making electrical contact with a respective one of said traces through said conductive material plating said walls; and conductive balls adhered to said traces proximate to said first end, each of said conductive pins being in electrical contact with a respective one of said conductive balls via one of said conductive traces, said conductive balls being formed in a pattern to correspond with a matching pattern of pads on a circuit board, said conductive balls being formed of a material which, when melted, fuse to said pads.

2. The adapter of claim 1 further comprising a restraining means for holding each of said conductive pins in a position substantially orthogonal to said top surface of said substrate to prevent said pins from bending under normal use.

3. The adapter of claim 1 further comprising a dielectric layer formed on said bottom surface of said substrate for exposing said conductive balls but not exposing said holes.

4. The adapter of claim 1 wherein said conductive pins are female connectors.

5. The adapter of claim 1 wherein said conductive balls comprise solder.

6. An adapter for emulating a ball grid array type package comprising:

a dielectric substrate, said substrate having an array of holes formed therein, each of said holes having walls at least partially plated with a conductive material, each of said holes having an opening in a top surface of said substrate;

a plurality of conductive pins, each of said pins being inserted into a respective one of said holes and projecting through said top surface, each of said pins making electrical contact with said conductive material plating said walls; and conductive balls formed on a bottom surface of said substrate, said conductive balls being in electrical contact with said conductive material plating said walls of respective ones of said holes and being in electrical contact with a respective one of said pins, said conductive balls being formed in a pattern to correspond with a matching pattern of pads on a circuit board, said conductive balls being formed of a material which, when melted, fuse to said pads.

7. The adapter of claim 6 further comprising conductive traces formed on said bottom surface of said substrate, each of said traces extending between a wall of a respective one of said holes and one of said conductive balls.

8. The adapter of claim 6 further comprising conductive traces electrically interconnecting said conductive balls with respective ones of said pins.

9. The adapter of claim 8 further comprising a dielectric layer formed on said bottom surface of said substrate for exposing said conductive balls but not exposing said holes.

10. The adapter of claim 6 further comprising a restraining means for holding each of said conductive pins in a position substantially orthogonal to said top surface of said substrate to prevent said pins from bending under normal use.

11. The adapter of claim 6 wherein said conductive pins are female connectors.

12. The adapter of claim 6 wherein said conductive balls comprise solder.

13. A method of fabricating an adapter for emulating a ball grid array type package, said method comprising the steps of:

forming a plurality of holes in a dielectric substrate, said holes having openings in a top surface of said substrate;

coating a bottom surface of said substrate and portions of walls of said holes with a conductive coating;

etching said conductive coating to form traces, each of said traces extending from said conductive coating on an associated one of said walls and terminating in a pad proximate to said associated one of said walls;

inserting conductive pins into said holes, said conductive pins being electrically connected to a respective pad via said conductive traces; and depositing a solder ball on each pad.

14. The method of claim 13 further comprising the step of forming a dielectric layer on said bottom surface of said substrate for exposing said pads and covering openings of said holes in said bottom surface.

15. The method of claim 13 further comprising the step of soldering said pins to said conductive coating after said pins are inserted into said holes.

*16. An adapter for emulating a ball grid array type package comprising:*

*a dielectric substrate, said substrate having an array of holes formed therein, each of said holes having an inner boundary defined by walls of each of said holes, each of said holes having within its inner boundary a conductive material, each of said holes having an opening in a top surface of said substrate;*

*a plurality of conductive pins, each of said pins being inserted into a respective one of said holes and protecting through said top surface, each of said pins making electrical contact with said conductive material within said inner boundary of a respective one of said holes; and*

*conductive balls formed on a bottom surface of said substrate, each of said conductive balls being in electrical contact with said conductive material within said inner boundary of a respective one of said holes and being in electrical contact with a respective one of said pins, said conductive balls being formed in a pattern to correspond with a matching pattern of pads on a circuit board, said conductive balls being formed of a material which, when melted, fuse to said pads.*

*17. The adapter of claim 16 further comprising conductive traces formed on said bottom surface of said substrate, each of said traces electrically connecting said conductive material within said inner boundary of a respective one of said holes and one of said conductive balls.*

*18. The adapter of claim 16 further comprising conductive traces electrically interconnecting said conductive balls with respective ones of said pins.*

*19. The adapter of claim 16 further comprising a dielectric layer formed on said bottom surface of said substrate for exposing said conductive balls.*

*20. The adapter of claim 16 further comprising a second substrate for holding each of said conductive sins in a position substantially orthogonal to said top surface of said dielectric substrate to help prevent said pins from bending under normal use.*

*21. The adapter of claim 16 wherein said conductive pins are female connectors.*

*22. The adapter of claim 16 wherein said conductive balls comprise solder.*

*23. A method of fabricating an adapter for emulating a ball grid array type package, said method comprising the steps of:*

*forming a plurality of holes in a dielectric substrate, said holes having openings in a top surface of said substrate;*

*providing a conductive material on a bottom surface of said substrate and over at least a portion of said holes;*

*etching said conductive material on said bottom surface to form traces, each of said traces being electrically connected to said conductive material over said at least a portion of said holes and terminating in a pad associated with one of said holes;*

*inserting conductive pins into said holes, said conductive pins being electrically connected to a respective pad via said conductive traces; and*

*depositing a solder ball on each pad.*

*24. The method of claim 23 further comprising the step of forming a dielectric layer on said bottom surface of said substrate for exposing said pads.*

*25. The method of claim 23 further comprising the step of providing a dielectric layer overlying said dielectric substrate for holding each of said conductive pins in a position substantially orthogonal to said top surface of said dielectric substrate to help prevent said pins from bending under normal use.*

* * * * *